US012199614B2

(12) United States Patent
Zhang et al.

(10) Patent No.: US 12,199,614 B2
(45) Date of Patent: Jan. 14, 2025

(54) LEVEL SHIFT CIRCUIT, INTEGRATED CIRCUIT, ELECTRONIC DEVICE

(71) Applicants: Beijing ESWIN Computing Technology Co., Ltd., Beijing (CN); Hefei ESWIN Computing Technology Co., Ltd., Hefei (CN)

(72) Inventors: Xiaoheng Zhang, Beijing (CN); Jiajhang Wu, Beijing (CN); Haohao Zhang, Beijing (CN)

(73) Assignees: BEIJING ESWIN COMPUTING TECHNOLOGY CO., LTD., Beijing (CN); HEFEI ESWIN COMPUTING TECHNOLOGY CO., LTD., Hefei (CN)

( * ) Notice: Subject to any disclaimer, the term of this patent is extended or adjusted under 35 U.S.C. 154(b) by 35 days.

(21) Appl. No.: 18/081,922

(22) Filed: Dec. 15, 2022

(65) Prior Publication Data

US 2023/0216487 A1 Jul. 6, 2023

(30) Foreign Application Priority Data

Dec. 30, 2021 (CN) .......................... 202111656675.8

(51) Int. Cl.
*H03K 19/0175* (2006.01)
*H03K 3/356* (2006.01)
(Continued)

(52) U.S. Cl.
CPC . *H03K 3/356113* (2013.01); *H03K 3/356182* (2013.01); *H03K 19/017509* (2013.01); *H03K 19/018521* (2013.01); *H03M 1/66* (2013.01)

(58) Field of Classification Search
CPC ....... H03K 19/0175; H03K 19/017509; H03K 19/1085; H03K 19/018507;
(Continued)

(56) References Cited

U.S. PATENT DOCUMENTS 9,997,208 B1 6/2018 Jung et al.
11,695,416 B2 * 7/2023 Lin ................ H03K 19/017509
327/108
(Continued)

FOREIGN PATENT DOCUMENTS

CN 1992526 A 7/2007
CN 110495099 A 11/2019
(Continued)

OTHER PUBLICATIONS

Ling-Han, X. et al., "Design of Voltage Comparators with Wide Input Common-Mode Range," Semiconductor Technology, Dec. 2007, pp. 1086-1089, vol. 32, No. 12. [Providing English Translation of Abstract only].

(Continued)

*Primary Examiner* — Long Nguyen
(74) *Attorney, Agent, or Firm* — Ladas & Parry, LLP

(57) ABSTRACT

The present application provides a level shift circuit, an integrated circuit, and an electronic device. The level shift circuit comprises: an input module, configured to output a first control signal according to a first power supply voltage signal, first and second input voltages, inverted voltages of the first and second input voltages that received; a control voltage generation module, configured to receive the first control signal, and generate a plurality of node voltages according to the first control signal and a second power supply voltage signal; and output control modules, configured to generate first to fourth output signals according to the node voltages and the first power supply voltage signal, or generate fifth to eighth output signals according to the second power supply voltage signal and the node voltages.

9 Claims, 8 Drawing Sheets

(51) Int. Cl.
*H03K 19/0185* (2006.01)
*H03M 1/66* (2006.01)

(58) Field of Classification Search
CPC ... H03K 19/018514; H03K 19/018521; H03K 19/018528; H03K 3/356113; H03M 1/66
See application file for complete search history.

(56) References Cited

U.S. PATENT DOCUMENTS

| | | |
|---|---|---|
| 2007/0146042 A1 | 6/2007 | Tsuchi et al. |
| 2015/0002206 A1 | 1/2015 | Nakamura |
| 2015/0097612 A1 | 4/2015 | Chuang et al. |
| 2017/0309211 A1 | 10/2017 | Zhang |

FOREIGN PATENT DOCUMENTS

| | | |
|---|---|---|
| CN | 111294042 A | 6/2020 |
| JP | H06243680 A | 9/1994 |
| JP | 2008258966 A | 10/2008 |

OTHER PUBLICATIONS

Search Report dated Nov. 10, 2022 from the Office Action for Chinese Application No. 202111656675.8 issued Nov. 21, 2022, 3 pages.
Tao, F. et al., "Design of New Level Shifter," Journal of University of Electronic Science and Technology of China, Jan. 2011, pp. 138-141, vol. 40, No. 1. [Providing English Translation of Abstract only].

\* cited by examiner

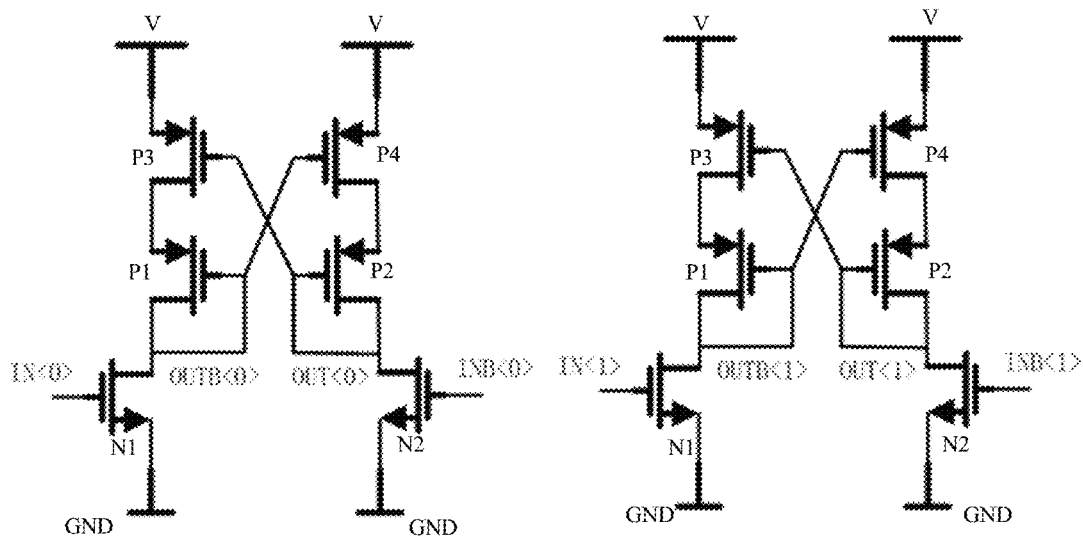
FIG. 1 (Prior Art)
| INPUT | | OUTPUT | |
|---|---|---|---|
| IN0 | INB0 | OUT0 | OUTB0 |
| 0 | 1 | 0 | 1 |
| 1 | 0 | 1 | 0 |
| INPUT | | OUTPUT | |
|---|---|---|---|
| IN1 | INB1 | OUT1 | OUTB1 |
| 0 | 1 | 0 | 1 |
| 1 | 0 | 1 | 0 |
FIG. 2 (Prior Art)
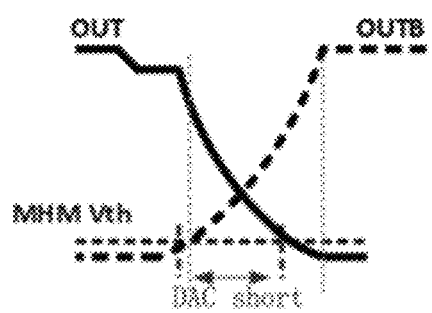
FIG. 3 (Prior Art)

| Input | | | | Output | | | |
|---|---|---|---|---|---|---|---|
| IN1 | IN0 | INB1 | INB0 | Y0 | Y1 | Y2 | Y3 |
| 0 | 0 | 1 | 1 | 1 | 0 | 0 | 0 |
| 0 | 1 | 1 | 0 | 0 | 1 | 0 | 0 |
| 1 | 0 | 0 | 1 | 0 | 0 | 1 | 0 |
| 1 | 1 | 0 | 0 | 0 | 0 | 0 | 1 |

| Input | | | | Output | | | |
|---|---|---|---|---|---|---|---|
| IN1 | IN0 | INB1 | INB0 | Y0' | Y1' | Y2' | Y3' |
| 0 | 0 | 1 | 1 | 0 | 1 | 1 | 1 |
| 0 | 1 | 1 | 0 | 1 | 0 | 1 | 1 |
| 1 | 0 | 0 | 1 | 1 | 1 | 0 | 1 |
| 1 | 1 | 0 | 0 | 1 | 1 | 1 | 0 |

LEVEL SHIFT CIRCUIT, INTEGRATED CIRCUIT, ELECTRONIC DEVICE

TECHNICAL FIELD

The present application relates to the technical field of semiconductors, and in particular, to a level shift circuit, an integrated circuit, and an electronic device.

BACKGROUND

A level shift circuit is a "conversion interface" between the low-voltage circuit and the high-voltage circuit. A low-voltage signal is converted into a high-voltage signal through the level shift circuit to realize a control of a low-voltage logic input stage to a high-voltage logic output stage. The level shift circuit has been widely applied in a display driver, a flash memory, etc.

SUMMARY

The present application proposes a level shift circuit, an integrated circuit, and an electronic device.

In a first aspect, an embodiment of the present application provides a level shift circuit, including:

an input module, configured to output a first control signal according to a first power supply voltage signal, a first input voltage, a second input voltage, an inverted voltage of the first input voltage and an inverted voltage of the second input voltage that received;

a control voltage generation module, configured to receive the first control signal and generate a plurality of node voltages according to the first control signal and a second power supply voltage signal; and output control modules, configured to generate a first output signal, a second output signal, a third output signal and a fourth output signal according to the node voltages and the first power supply voltage signal; or generate a fifth output signal, a sixth output signal, a seventh output signal, and an eighth output signal according to the second power supply voltage signal and the node voltages;

wherein four different logic states of the first input voltage and the second input voltage respectively indicate that the first output signal, the second output signal, the third output signal, and the fourth output signal are in high level, and in each logic state, only one output signal is in high level and the other three output signals are in low level; and four different logic states of the first input voltage and the second input voltage respectively indicate that the fifth output signal, the sixth output signal, the seventh output signal, and the eighth output signal are in low level, and in each logic state, only one output signal is in low level and the other three output signals are in high level.

Optionally, the plurality of node voltages comprise a plurality of first node voltages and a plurality of second node voltages, and the output control modules comprise a first output control module and a second output control module;

the first output control module has first terminals respectively connected to a first output node corresponding to the first output signal, a second output node corresponding to the second output signal, a third output node corresponding to the third output signal and a fourth output node corresponding to the fourth output signal, and second terminals connected to second nodes corresponding to the second node voltages or first nodes corresponding to the first node voltages, and a control terminal configured to receive the second node voltages and cause, according to the second node voltages, the first output node, the second output node, the third output node and the fourth output node to be input with the second node voltages or the first node voltages; and the second output control module has a first terminal connected to a first power supply voltage signal terminal, and second terminals respectively connected to the first output node, the second output node, the third output node and the fourth output node and a control terminal configured to receive the first node voltage and cause, according to the first node voltages, the first output node, the second output node, the third output node and the fourth output node to be input with the first power supply voltage signal.

Optionally, the plurality of node voltages comprise a plurality of first node voltages and a plurality of second node voltages, and the output control module comprises a third output control module and a fourth output control module;

the third output control module has first terminals respectively connected to a fifth output node corresponding to the fifth output signal, a sixth output node corresponding to the sixth output signal, a seventh output node corresponding to the seventh output signal and an eighth output node corresponding to the eighth output signal, and a second terminal connected to a second power supply voltage signal terminal and a control terminal configured to receive the second node voltages and cause, according to the second node voltages, the fifth output node, the sixth output node, the seventh output node and the eighth output node to be input with the second power supply voltage signal; and the fourth output control module have first terminals connected to first nodes corresponding to the first node voltages, and second terminals respectively connected to the fifth output node, the sixth output node, the seventh output node and the eighth output node and a control terminal configured to receive the first node voltages and cause, according to the first node voltages, the fifth output node, the sixth output node, the seventh output node and the eighth output node to be input with the first node voltages.

Optionally, the input module comprises a first input sub-module and a second input sub-module;

the first input sub-module comprises a first transistor and a second transistor;

the first transistor has a first terminal connected to the first power supply voltage signal terminal, a second terminal connected to a first one of the first nodes (which may be interchanged with a first first node or a first-first node herein), and a control terminal connected to the first input voltage;

the second transistor has a first terminal connected to the first power supply voltage signal terminal, a second terminal connected to a second one of the first nodes (which may be interchanged with a second first node or a second-first node herein), and a control terminal connected to an inverted voltage of the first input voltage;

the second input sub-module comprises a seventh transistor and an eighth transistor;

the seventh transistor has a first terminal connected to the first power supply voltage signal terminal, a second terminal connected to a third one of the first nodes (which may be interchanged with a third first node or a third-first node herein), and a control terminal connected to the second input voltage; and the eighth transistor has a first terminal connected to the first power supply voltage signal terminal, a second terminal connected to a fourth one of the first nodes (which may be interchanged with a fourth first node or a fourth-first node herein), and a control terminal connected to an inverted voltage of the second input voltage.

Optionally, the control voltage generation module comprises a first bias unit, a second bias unit, a first load unit and a second load unit;

the first bias unit is configured to limit voltages of the first one of the first nodes and the second one of the first node, and the second bias unit is configured to limit voltages of the third one of the first nodes and the fourth one of the first nodes;

the first load unit is configured to control voltages of a first one of the second nodes (which may be interchanged with a first second node or a first-second node herein) and a second one of the second nodes (which may be interchanged with a second second node or a second-second node herein) according to the voltages of the first one of the first nodes and the second one of the first nodes; and the second load unit is configured to control voltages of a third one of the second node (which may be interchanged with a third second node or a third-second node herein) and a fourth one of the second nodes (which may be interchanged with a fourth second node or a fourth-second node herein) according to the voltages of the third one of the first nodes and the fourth one of the first nodes.

Optionally, the first bias unit comprises a third transistor and a fourth transistor;

the third transistor has a first terminal connected to the first one of the first nodes, a second terminal connected to the first one of the second nodes, and a control terminal connected to the first one of the first nodes or a bias voltage terminal; and the fourth transistor has a first terminal connected to the second one of the first nodes, a second terminal connected to the second one of the second nodes, and a control terminal connected to the second one of the first nodes or the bias voltage terminal;

the first load unit comprises a fifth transistor and a sixth transistor;

the fifth transistor has a first terminal connected to the first one of the second nodes, a control terminal connected to the second one of the first nodes, and a second terminal connected to the second power supply voltage signal terminal; and the sixth transistor has a first terminal connected to the second one of the second nodes, a control terminal connected to the first one of the first nodes, and a second terminal connected to the second power supply voltage signal terminal;

the second bias unit comprises a ninth transistor and a tenth transistor;

the ninth transistor has a first terminal connected to the third one of the first nodes, a second terminal connected to the third one of the second nodes, and a control terminal connected to the third one of the first nodes or the bias voltage terminal; and the tenth transistor has a first terminal connected to the fourth one of the first nodes, a second terminal connected to the fourth one of the second nodes, and a control terminal connected to the fourth one of the first nodes or the bias voltage terminal;

the second load unit comprises an eleventh transistor and a twelfth transistor; and the eleventh transistor has a first terminal connected to the third one of the second nodes, a control terminal connected to the fourth one of the first nodes, and a second terminal connected to the second power supply voltage signal terminal; and the twelfth transistor has a first terminal connected to the fourth one of the second nodes, a control terminal connected to the third one of the first nodes, and a second terminal connected to the second power supply voltage signal terminal.

Optionally, the first output control module comprises a first first output control sub-module, a second first output control sub-module, a third first output control sub-module module and a fourth first output control sub-module;

the first first output control sub-module comprises a thirteenth transistor and a fourteenth transistor;

the thirteenth transistor has a first terminal connected to the first output node, a second terminal connected to a first terminal of the fourteenth transistor, and a control terminal connected to a second one of the second nodes; and the fourteenth transistor has a second terminal connected to a third one of the second nodes, and a control terminal connected to a fourth one of the second nodes;

the second first output control sub-module comprises a fifteenth transistor and a sixteenth transistor;

the fifteenth transistor has a first terminal connected to the second output node, a second terminal connected to a first terminal of the sixteenth transistor, and a control terminal t connected to the fourth one of the second nodes; and the sixteenth transistor has a second terminal connected to the second one of the second nodes, and a control terminal connected to a first one of the second nodes;

the third first output control sub-module comprises a seventeenth transistor and an eighteenth transistor;

the seventeenth transistor has a first terminal connected to the third output node, a second terminal connected to a first terminal of the eighteenth transistor, and a control terminal connected to the third one of the second nodes; and the eighteenth transistor has a second terminal connected to the first one of the second nodes, and a control terminal connected to the second one of the second nodes;

the fourth first output control sub-module comprises a nineteenth transistor and a twentieth transistor; and the nineteenth transistor has a first terminal connected to the fourth output node, a second terminal connected to a first terminal of the twentieth transistor, and a control terminal connected to the first one of the second nodes; and the twentieth transistor has a second terminal connected to the fourth one of the second nodes, and a control terminal connected to the third one of the second nodes.

Optionally, the first output control module comprises a first first output control sub-module, a second first output control sub-module, a third first output control sub-module module and a fourth first output control sub-module;

the first first output control sub-module comprises a thirteenth transistor and a fourteenth transistor;

the thirteenth transistor has a first terminal connected to the first output node, a second terminal connected to a first terminal of the fourteenth transistor, and a control terminal connected to a second one of the second nodes; and the fourteenth transistor has a second terminal connected to a third one of the first nodes, and a control terminal connected to a fourth one of the second nodes;

the second first output control sub-module comprises a fifteenth transistor and a sixteenth transistor;

the fifteenth transistor has a first terminal connected to the second output node, a second terminal connected to a first terminal of the sixteenth transistor, and a control terminal connected to the fourth one of the second nodes; and the sixteenth transistor has a second terminal connected to a second one of the first nodes, and a control terminal connected to a first one of the second nodes;

the third first output control sub-module comprises a seventeenth transistor and an eighteenth transistor;

the seventeenth transistor has a first terminal connected to the third output node, a second terminal connected to a first terminal of the eighteenth transistor, and a control terminal connected to a third one of the second nodes; and a second terminal of the eighteenth transistor is connected to a first one of the first nodes, and a control terminal connected to the second one of the second nodes;

the fourth first output control sub-module comprises a nineteenth transistor and a twentieth transistor; and the nineteenth transistor has a first terminal connected to the fourth output node, a second terminal connected to a first terminal of the twentieth transistor, and a control terminal connected to the first one of the second nodes; and the twentieth transistor has a second terminal connected to a fourth one of the first nodes, and a control terminal connected to the third one of the second nodes.

Optionally, the second output control module comprises a first second output control sub-module, a second second output control sub-module, a third second output control sub-module, and a fourth second output control sub-module;

the first second output control sub-module comprises a twenty-first transistor and a twenty-second transistor;

a first terminal of the twenty-first transistor and a first terminal of the twenty-second transistor are both connected to the first power supply voltage signal terminal, a second terminal of the twenty-first transistor and a second terminal of the twenty-second transistor are both connected to the first output node, a control terminal of the twenty-first transistor is connected to a second one of the first nodes, and a control terminal of the twenty-second transistor is connected to the fourth one of the first nodes;

the second second output control sub-module comprises a twenty-third transistor and a twenty-fourth transistor;

a first terminal of the twenty-third transistor and a first terminal of the twenty-fourth transistor are both connected to the first power supply voltage signal terminal, a second terminal of the twenty-third transistor and a second terminal of the twenty-fourth transistor are both connected to the second output node, a control terminal of the twenty-third transistor is connected to a first one of the first nodes, and a control terminal of the twenty-fourth transistor is connected to the fourth one of the first nodes;

the third second output control sub-module comprises a twenty-fifth transistor and a twenty-sixth transistor;

a first terminal of the twenty-fifth transistor and a first terminal of the twenty-sixth transistor are both connected to the first power supply voltage signal terminal, a second terminal of the twenty-fifth transistor and a second terminal of the twenty-sixth transistor are both connected to the third output node, a control terminal of the twenty-fifth transistor is connected to the second one of the first nodes, and a control terminal of the twenty-sixth transistor is connected to the third one of the first nodes;

the fourth second output control sub-module comprises a twenty-seventh transistor and a twenty-eighth transistor; and a first terminal of the twenty-seventh transistor and a first terminal of the twenty-eighth transistor are both connected to the first power supply voltage signal terminal, a second terminal of the twenty-seventh transistor and a second terminal of the twenty-eighth transistor are both connected to the fourth output node, a control terminal of the twenty-seventh transistor is connected to the first one of the first nodes, and a control terminal of the twenty-eighth transistor is connected to the third one of the first nodes.

Optionally, the third output control module comprises a first third output control sub-module, a second third output control sub-module, a third third output control sub-module module and a fourth third output control sub-module;

the first third output control sub-module comprises a twenty-ninth transistor and a thirtieth transistor;

he twenty-ninth transistor and the thirtieth transistor have first terminals each connected to the fifth output node, second terminals each connected to the second power supply voltage signal terminal, and control terminals respectively connected to a first one of the second nodes and a third one of the second nodes;

the second third output control sub-module comprises a thirty-first transistor and a thirty-second transistor;

the thirty-first transistor and the thirty-second transistor have first terminals each connected to the sixth output node, second terminals each connected to the second power supply voltage signal terminal, and control terminals respectively connected to a second one of the second nodes and a third one of the second nodes;

the third third output control sub-module comprises a thirty-third transistor and a thirty-fourth transistor;

the thirty-third transistor and the thirty-fourth transistor have first terminals each connected to the seventh output node, second terminals each connected to the second power supply voltage signal terminal, and control terminals respectively connected to the first one of the second nodes and a fourth one of the second nodes;

the fourth third output control sub-module comprises a thirty-fifth transistor and a thirty-sixth transistor; and the thirty-fifth transistor and the thirty-sixth transistor have first terminals each connected to the eighth output node, second terminals each connected to the second power supply voltage signal terminal, and control terminals respectively connected to the second one of the second nodes and the fourth one of the second nodes.

Optionally, the fourth output control module comprises a first fourth output control sub-module, a second fourth output control sub-module, a third fourth output control sub-module module, and a fourth fourth output control sub-module;

the first fourth output control sub-module comprises a thirty-seventh transistor and a thirty-eighth transistor;

the thirty-seventh transistor has a first terminal connected to a fourth one of the first nodes, a second terminal connected to a first terminal of the thirty-eighth transistor, and a control terminal connected to a third one of the first nodes; and the thirty-eighth transistor has a second terminal connected to the fifth output node, and a control terminal connected to a first one of the first nodes;

the second fourth output control sub-module comprises a thirty-ninth transistor and a fortieth transistor;

the thirty-ninth transistor has a first terminal connected to the first one of the first nodes, a second terminal connected to a first terminal of the fortieth transistor, and a control terminal connected to a second one of the first nodes; and the fortieth transistor has a second terminal connected to the sixth output node, and a control terminal connected to the third one of the first nodes;

the third fourth output control sub-module comprises a forty-first transistor and a forty-second transistor;

the forty-first transistor has a first terminal connected to the second one of the first nodes, a second terminal connected to a first terminal of the forty-second transistor, and a control terminal connected to the first one of the first nodes; and the forty-second transistor has a second terminal connected to the sixth output node, and a control terminal connected to the fourth one of the first nodes; and the fourth fourth output control sub-module comprises a forty-third transistor and a forty-fourth transistor; the forty-third transistor has a first terminal connected to the third one of the first nodes, a second terminal connected to a first terminal of the forty-fourth transistor, and a control terminal connected to the fourth one of the first nodes; the forty-fourth transistor has a second terminal connected to the sixth output node, and a control terminal connected to the second one of the first nodes.

In a second aspect, an embodiment of the present application provides an integrated circuit, including the level shift circuit described in the first aspect, and further including a digital-to-analog converter; and an output signal from the level shift circuit is used to control transistors in the digital-to-analog converter to be turned on or off.

In a third aspect, an embodiment of the present application provides an electronic device, including the integrated circuit described in the second aspect.

The above description is only an overview of the technical solutions of the embodiments of the present application. In order to understand the technical means of the embodiments of the present application more clearly in order to implement them according to the contents of the description, and also to make those and other purposes, features and advantages more clear, the specific implementations of the embodiments of the present application will be described below.

BRIEF DESCRIPTION OF THE DRAWINGS

The above and/or additional aspects and advantages of the present application will become apparent and be readily understood from the following description of embodiments with reference to the accompanying drawings, in which:

FIG. 1 is a schematic diagram of a traditional level shift circuit;

FIG. 2 is an input and output truth table of the traditional level shift circuit;

FIG. 3 is an output waveform diagram of the traditional level shift circuit;

DETAILED DESCRIPTION

Figure 4:
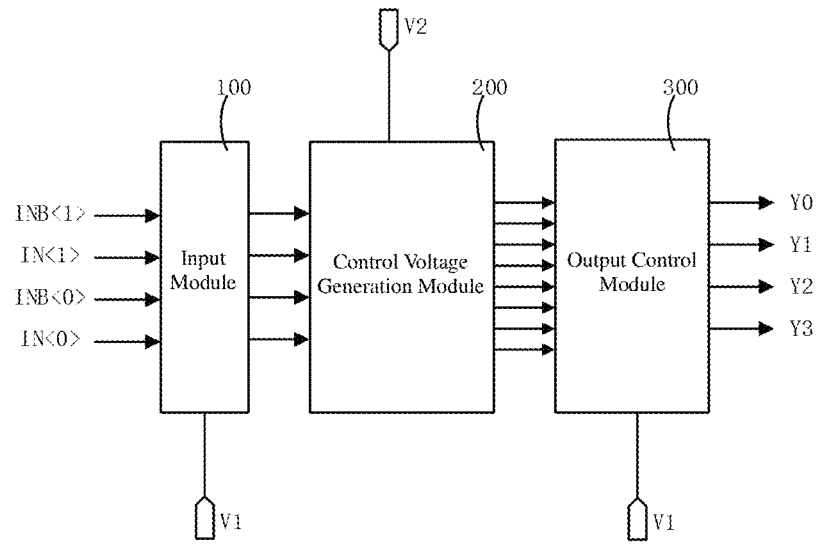
FIG. 4 is a schematic diagram of an N-type level shift circuit module in an embodiment of the present application.

Examples of embodiments of the present application will be illustrated below in the drawings throughout which same or similar reference numerals refer to same or similar elements or elements having same or similar functions. Also, detailed descriptions of known technologies will be omitted if they are not necessary for the illustrated features of the present application. The embodiments described with reference to the drawings are illustrative, merely used for explaining the present application and should not be regarded as any limitations thereto.

It may be understood by those skilled in the art that, unless otherwise defined, all terms (including technical and scientific terms) used herein have the same meaning as commonly understood by a person of ordinary skill in the art to which the present application belongs. It should also be understood that terms, such as those defined in a general dictionary, should be understood to have meanings consistent with their meanings in the context of the prior art and, unless specifically defined as herein, should not be interpreted in idealistic or overly formal meaning.

It may be understood by those skilled in the art that singular forms "a", "an", "said", and "the" may be intended to include plural forms as well, unless otherwise stated. It should be further understood that terms "include/including" used in this specification specify the presence of the stated features, integers, steps, operations, elements and/or components, but not exclusive of the presence or addition of one or more other features, integers, steps, operations, elements, components, and/or combinations thereof. It should be understood that, when an element is referred to as being "connected to" another element, it may be directly connected to the other element or provided with intervening elements therebetween. Also, "connection" as used herein may include wireless connection. As used herein, the wording "and/or" includes all or any of one or more associated listed items or combinations thereof.

As shown in FIG. 1, FIG. 1 is a traditional level shift circuit, including: two N-type MOS (Metal-Oxide-Semiconductor) transistors N1, N2 and four P-type MOS transistors P1, P2, P3, P4. Gates of the MOS transistors N1 and N2 are respectively input with an inverted input voltage of an input voltage. When the input voltage IN<0> has a low level (i.e., a logic value 0), the inverted input voltage INB<0> has a high level (i.e., a logic value 1), thus the MOS transistor N1 is not turned on, the MOS transistor N2 is turned on, and a gate of the MOS transistor P3 is input with a reference ground voltage GND so that the MOS transistor P3 is turned on. A source of the MOS transistor P1 is input with a high voltage signal V, and a drain of the MOS transistor P1 is short-circuited with the gate thereof, thus the drain of the MOS transistor P1 outputs an inverted output voltage OUTB<0> of the logic value 1. Because the MOS transistors P2 and P4 are not turned on, the output voltage OUT<0> is in logic 0. When the input voltage IN<O>has the logic value 1, the inverted input voltage INB<0> has the logic value 0, thus the MOS transistor N2 is not turned on, the MOS transistor N1 is turned on, and a gate of the MOS transistor P4 is input with a reference ground voltage so that the MOS transistor P4 is turned on. A source of the MOS transistor P2 is input with a high-voltage signal V, and a drain of the MOS transistor P2 is short-circuited with the gate thereof, thus the drain of the MOS transistor P2 outputs an output voltage OUT<0> of the logic value 1. Because the MOS transistors P1 and P3 are not turned on, the output voltage OUTB<0> has the logic value 0. Similarly, when the input voltage IN<1> has the logic value 0, the inverted output voltage OUTB<1> has the logic value 1, and the output voltage OUT<1> has the logic value 0. When the input voltage IN<1> has the logic value 1, the inverted output voltage OUTB<1> has the logic value 0, and the output voltage OUT<1> has the logic value 1. The truth table corresponding to the level shift circuit of FIG. 1 is shown in FIG. 2.

Referring to FIG. 2, the logic state of the input voltage IN is always the same as the logic state of the output voltage OUT, and the logic state of the inverted input voltage INB is always the same as the logic state of the inverted output voltage OUTB. The traditional level shift circuit can only output a pair of high voltage signals with opposite phases according to the input voltage. The traditional level shift circuit can only convert low-voltage signals into high-voltage signals, and does not have a decoding function. Therefore, output voltages need to be decoded by a large number of transistors arranged in the digital-to-analog converter after being received by the analog-to-digital converter from the level shift circuit, resulting in a large layout area of the analog-to-digital converter.

In addition, referring to FIG. 3, FIG. 3 is an output waveform diagram of a traditional level shift circuit. When the output voltage OUT changes from the logic value 1 to the logic value 0, the inverted output voltage OUTB changes from the logic value 0 to the logic value 1, resulting in overlapping of the output voltage OUT and the inverted output voltage OUTB. When the voltage in the overlapping area is greater than turn-on voltages of the transistors in the analog-to-digital converter, some transistors in the analog-to-digital converter may be turned on at the same time and short-circuit current (DAC short in FIG. 3 represents the short-circuit area of the analog-to-digital converter) may be produced, which may introduce noise to the circuit and interfere with the transmitted signal.

Based on the above problems, the present application proposes a novel level shift circuit which is used to solve the problem that the traditional level shift circuit does not have a decoding function and there is an overlapping phenomenon during transitions between high and low levels.

The technical solutions of the present application and how to solve the above technical problems by the technical solutions of the present application will be described below based on specific embodiments in detail.

Figure 5:
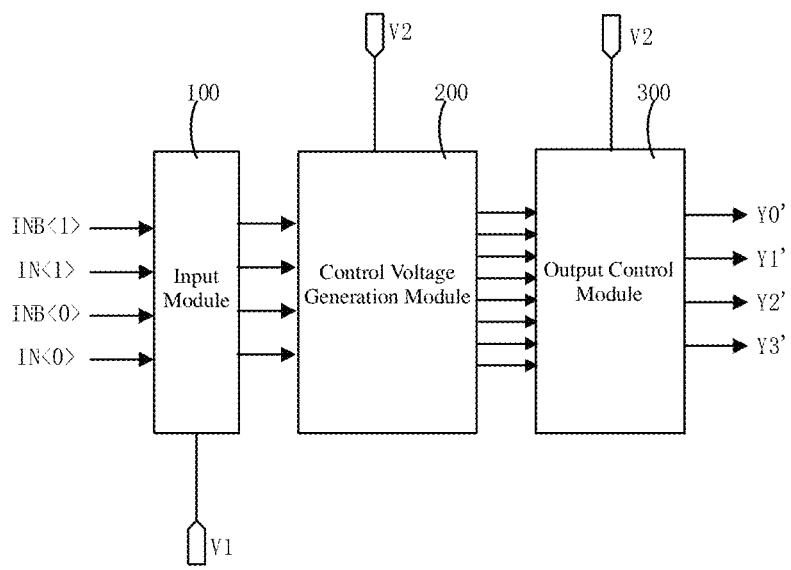
FIG. 5 is a schematic diagram of a P-type level shift circuit module in an embodiment of the present application.

Referring to FIG. 4 and FIG. 5, an embodiment of the present application provides a level shift circuit, including: an input module 100, a control voltage generation module 200, and an output control module 300. The input module 100 is configured to output a first control signal according to a received first power supply voltage signal V1, a first input voltage IN<0>, a second input voltage IN<1>, an inverted voltage INB<0> of the first input voltage and an inverted voltage INB<1> of the second input voltage. The control voltage generation module 200 is configured to receive the first control signal, and generate a plurality of node voltages according to the first control signal and a second power supply voltage signal V2. Referring to FIG. 4, the output control module 300 is configured to generate a first output signal Y0, a second output signal Y1, a third output signal Y2 and a fourth output signal Y3 according to the node voltages and the first power supply voltage signal V1. Alternatively, referring to FIG. 5, the output control module 300 is configured to generate a fifth output signal Y0', a sixth output signal Y1', a seventh output signal Y2' and an eighth output signal Y3' according to the second power supply voltage signal V2 and the node voltages.

Referring to FIG. 4, four different logic states of the first input voltage IN<0> and the second input voltage IN<1> (IN<0> and IN<1> are 00, 10, 01, 11) respectively indicate that the first output signal Y0, the second output signal Y1, the third output signal Y2, and the fourth output signal Y3 are in high level (i.e., have the logic value 1), and in each logic state, only one output signal is in high level and the other three output signals are in low level (i.e., have the logic value 0).

Referring to FIG. 5, four different logic states of the first input voltage IN<0> and the second input voltage IN<1> (IN<0> and IN<1> are 00, 10, 01, 11) respectively indicate that the fifth output signal Y0', the sixth output signal Y1', the seventh output signal Y2' and the eighth output signal Y3' are in low level (i.e., have the logic value 0), and in each logic state, only one output signal is in low level and the other three output signals are in high level (i.e., have the logic value 1).

Specifically, in the embodiment of the present application, the first power supply voltage signal V1 may be set as a low-level voltage signal (for example, a reference ground voltage signal), the second power supply voltage signal V2 may be set as a high-level voltage signal, the first control signal may be a low-level voltage signal, and some of the node voltages are low-level voltages and some are high-level voltages according to the specific setting of the circuit.

The level shift circuit in an embodiment of the present application includes: an input module 100, a control voltage generation module 200, and output control modules 300. The input module 100 is configured to output a first control signal according to a first power supply voltage signal V1, a first input voltage IN<0>, a second input voltage IN<1>, an inverted voltage INB<0> of the first input voltage and an inverted voltage INB<1> of the second input voltage that received. The control voltage generation module 200 is configured to receive the first control signal, and generate a plurality of node voltages according to the first control signal and a second power supply voltage signal V2. The output control modules 300 are configured to generate a first output signal Y0, a second output signal Y, a third output signal Y2 and a fourth output signal Y3 according to the node voltages and the first power supply voltage signal V1. Alternatively, the output control modules 300 are configured to generate a fifth output signal Y0', a sixth output signal Y1', a seventh output signal Y2' and an eighth output signal Y3' according to the second power supply voltage signal V2 and the node voltages. In an embodiment of the present application, the input module 100 and the control voltage generation module 200 generate node voltages according to an input voltage signal, and then control the output control modules 300 through the node voltages to generate output voltages. The output signals may not be overlapped during the transitions between high and low levels due to delays of changes among the node voltages, thus the generation of short-circuit current when some transistor switches in an analog-to-digital converter are turned on at the same time may be avoided. In addition, four different logic states of the first input voltage IN<0> and the second input voltage IN<1> respectively indicate that the first output signal Y0, the second output signal Y1, the third output signal Y2, and the fourth output signal Y3 are in high level, and in each logic state, only one output signal is in high level and the other three output signals are in low level; and four different logic states of the first input voltage IN<0> and the second input voltage IN<1> respectively indicate that the fifth output signal Y0', the sixth output signal Y1', the seventh output signal Y2' and the eighth output signal Y3' are in low level, and in each logic state, only one output signal is in low level and the other three output signals are in high level. Therefore, the level shift circuit in the embodiment of the present application has a decoding function, and thus the circuit structure of the digital-to-analog converter can be simplified.

The level shift circuit in the embodiment of the present application includes an N-type level shift circuit and a P-type level shift circuit. Each of the N-type level shift circuit and the P-type level shift circuit includes an input module 100, a control voltage generation module 200 and output control modules 300. The circuit elements and connection relationships of the input module 100 and the control voltage generation module 200 included in the N-type level shift circuit are the same as those of the input module 100 and the control voltage generation module 200 included in the P-type level shift circuit. The circuit connection relationships of the output control modules 300 included in the N-type level shift circuit are different from those of the output control modules 300 included in the P-type level shift circuit. The circuit elements and connection relationships of the N-type level shift circuit and the P-type level shift circuit in the embodiment of the present application will be described below in detail with reference to the accompanying drawings.

Figure 6:
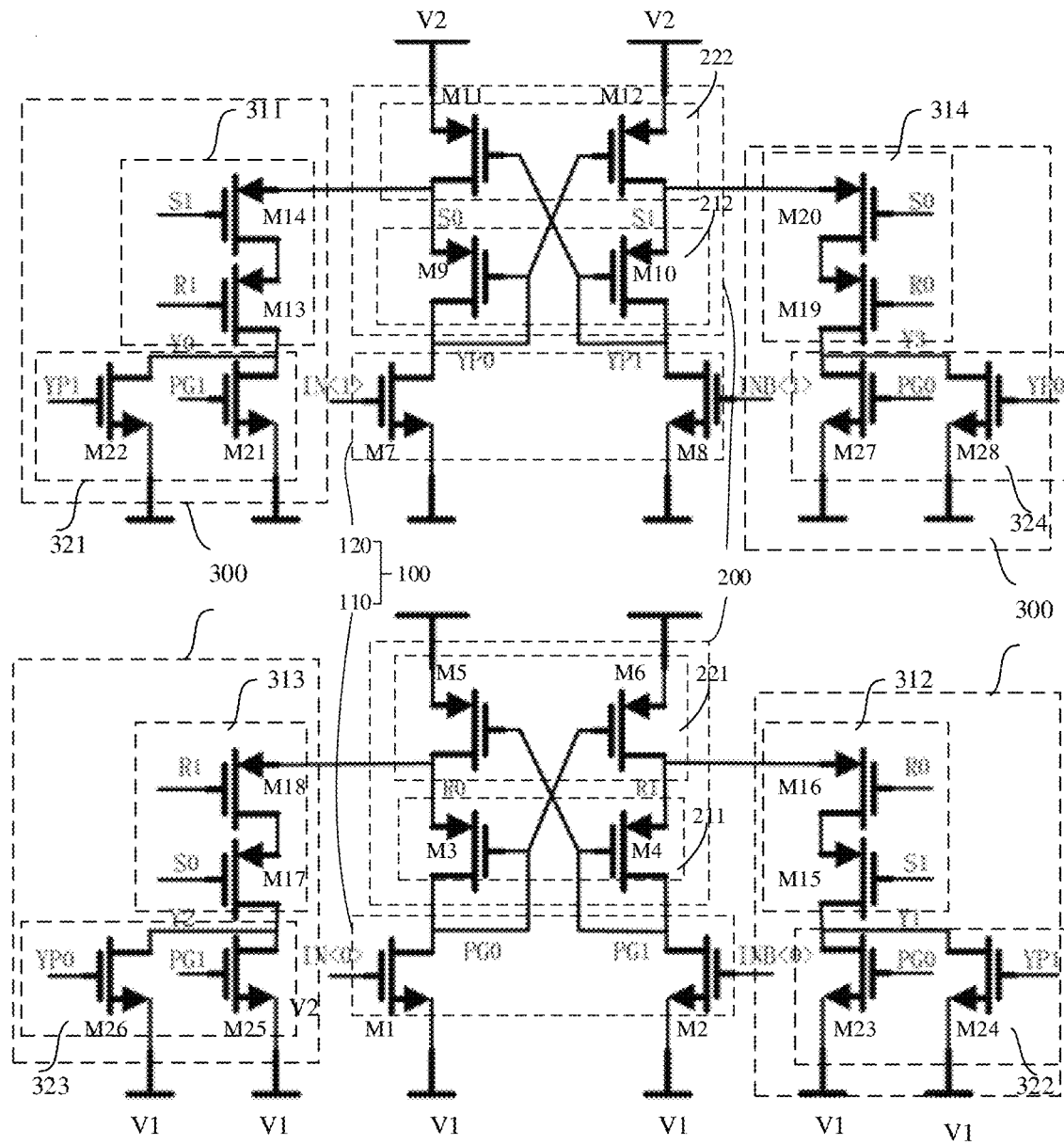
FIG. 6 is a schematic diagram of an N-type level shift circuit in an embodiment of the present application.
Figure 7:
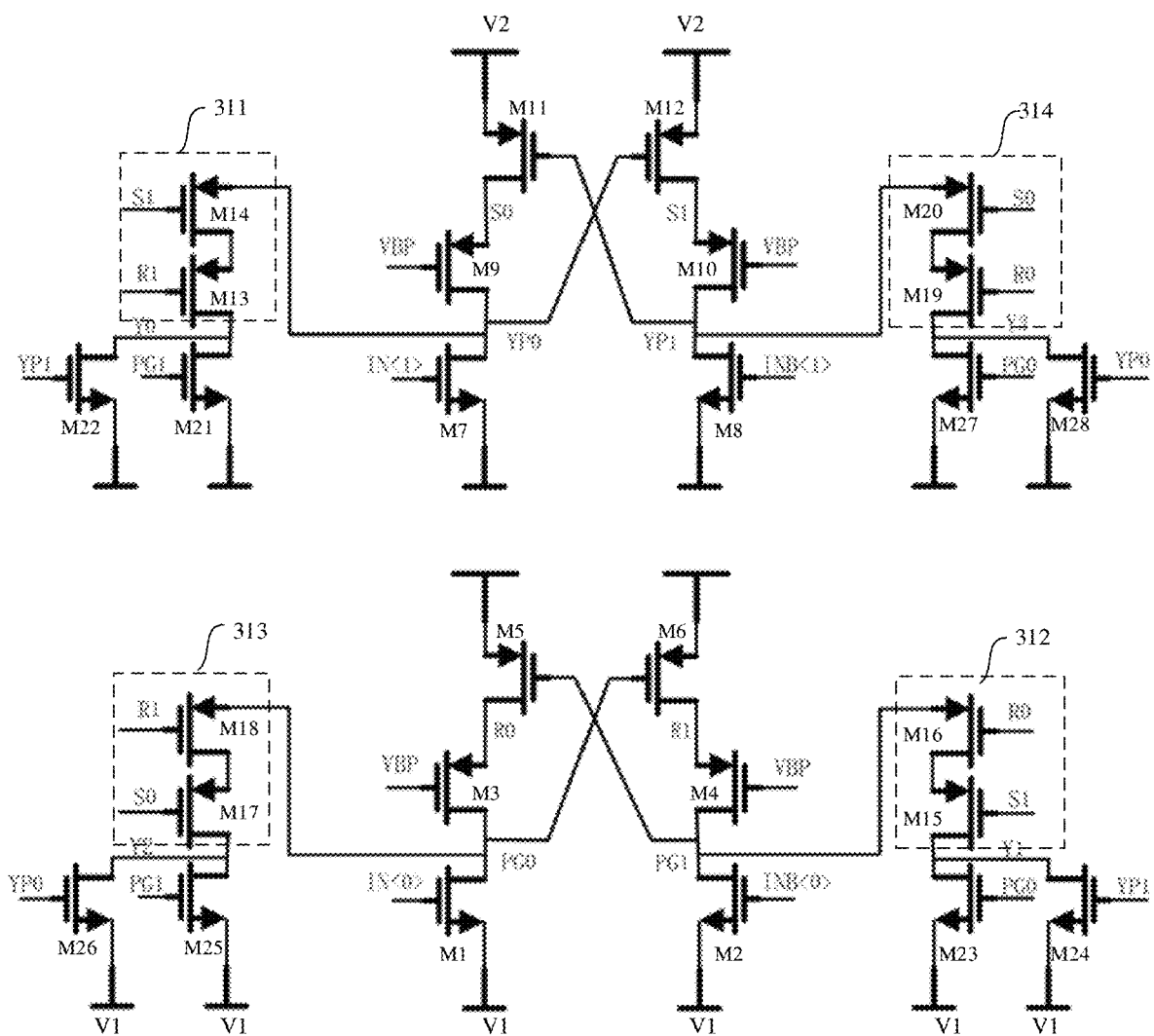
FIG. 7 is a schematic diagram of another N-type level shift circuit in an embodiment of the present application.

In a specific embodiment, referring to FIG. 6 and FIG. 7, for the N-type level shift circuit and the P-type level shift circuit, the input module 100 includes a first input sub-module 110 and a second input sub-module 120. The first input sub-module 110 includes a first transistor M1 and a second transistor M2. The first transistor M1 has a first terminal connected to the first power supply voltage signal terminal (a port for outputting the first power supply voltage signal V1), a second terminal connected to the first first node PG0, and a control terminal connected to the first input voltage IN<0>. The second transistor M2 has a first terminal connected to the first power supply voltage signal terminal (a port for outputting the first power supply voltage signal V1), a second terminal connected to the second first node PG1, and a control terminal connected to an inverted voltage INB<0> of the first input voltage. The second input sub-module 120 includes a seventh transistor M7 and an eighth transistor M8. The seventh transistor M7 has a first terminal connected to the first power supply voltage signal terminal (a port for outputting the first power supply voltage signal V1), a second terminal connected to the third first node YP0, and a control terminal connected to the second input voltage IN<1>. The eighth transistor M8 has a first terminal connected to the first power supply voltage signal terminal (a port for outputting the first power supply voltage signal V1), a second terminal connected to the fourth first node YP1, and a control terminal connected to an inverted voltage INB<1> of the second input voltage.

Still referring to FIG. 6 and FIG. 7, for the N-type level shift circuit and the P-type level shift circuit, the control voltage generation module 200 includes a first bias unit 211, a second bias unit 212, a first load unit 221 and a second load unit 222. The first bias unit 211 is configured to limit a voltage of the first first node PG0 and a voltage of the second first node PG1, and the second bias unit 212 is configured to limit a voltage of the third first node YP0 and a voltage of the fourth first node YP1. A conversion peak current of the level shift circuit itself is limited to reduce the power supply noise. Thus, the switching time between the output signal states is speeded up. Meanwhile, the circuit driving capability is improved and the robustness of the level shift circuit is improved. The first load unit 221 is configured to control a voltage of the first second node R0 and a voltage of the second second node R1 according to the voltage of the first first node PG0 and the voltage of the second first node PG1. The second load unit is configured to control a voltage of the third second node S0 and a voltage of the fourth second node S1 according to the voltage of the third first node YP0 and the voltage of the fourth first node YP1.

Specifically, referring to FIG. 6 and FIG. 7, the first bias unit 211 includes: a third transistor M3 and a fourth transistor M4. The third transistor M3 has a first terminal connected to the first first node PG0, a second terminal connected to the first second node R0, and a control terminal connected to the first first node PG0 or a bias voltage terminal (a port for outputting a bias voltage VBP). The fourth transistor M4 has a first terminal connected to the second first node PG1, a second terminal connected to a second second node R1, and a control terminal connected to the second first node PG1 or a bias voltage terminal (a port for outputting the bias voltage VBP).

The first load unit 221 includes a fifth transistor M5 and a sixth transistor M6. The fifth transistor M5 has a first terminal connected to the first second node R0, a control terminal connected to the second first node PG1, and a second terminal connected to the second power supply voltage signal terminal (a port for outputting the second power supply voltage signal V2). The sixth transistor M6 has a first terminal connected to the second second node R1, a control terminal connected to the first first node PG0, and a second terminal connected to the second power supply voltage signal terminal (a port for outputting the second power supply voltage signal V2).

The second bias unit 212 includes a ninth transistor M9 and a tenth transistor M10. The ninth transistor M9 has a first terminal connected to the third first node YP0, a second terminal connected to the third second node S0, and a control terminal connected to the third first node YP0 or a bias voltage terminal (a port for outputting the bias voltage VBP). The tenth transistor M10 has a first terminal connected to the fourth first node YP1, a second terminal connected to a fourth second node 51, and a control terminal connected to the fourth first node YP1 or a bias voltage terminal (a port for outputting the bias voltage VBP).

The second load unit 222 includes an eleventh transistor M11 and a twelfth transistor. The eleventh transistor M11 has a first terminal connected to the third second node S0, a control terminal connected to the fourth first node YP1, and a second terminal connected to the second power supply voltage signal terminal (a port for outputting the second power supply voltage signal V2). The twelfth transistor M12 has a first terminal connected to the fourth second node S1, a control terminal connected to the third first node YP0, and a second terminal connected to the second power supply voltage signal terminal (a port for outputting the second power supply voltage signal V2).

In a specific embodiment, referring to the N-type level shift circuit shown in FIG. 6 and FIG. 7, the plurality of node voltages include a plurality of first node voltages (the first node includes PG0, PG1, YP0 and YP1 in FIG. 6 and FIG. 7) and a plurality of second node voltages (the second node includes R0, R1, S0 and S1 in FIG. 6 and FIG. 7), and the output control modules 300 includes a first output control module (311, 312, 313 and 314 in FIG. 6) and a second output control module (321, 322, 323 and 324 in FIG. 6).

The first output control module has first terminals respectively connected to a first output node corresponding to the first output signal Y0, a second output node corresponding to the second output signal Y1, a third output node corresponding to the third output signal Y2 and a fourth output node corresponding to the fourth output signal Y3, second terminals connected to second nodes (R0, R1, S0 and S1) corresponding to the second node voltages or first nodes (PG0, PG1, YP0 and YP1) corresponding to the first node voltages, and control terminals configured to receive the second node voltages and cause, according to the second node voltages, the first output node, the second output node, the third output node and the fourth output node to be input with the second node voltages or the first node voltages.

The second output control module has a first terminal connected to the first power supply voltage signal terminal (the port for outputting the first power supply voltage V1), second terminals respectively connected to the first output node (the node corresponding to the first output signal Y0), the second output node (the node corresponding to the second output signal Y1), the third output node (the node corresponding to the third output signal Y2) and the fourth output node (the node corresponding to the fourth output signal Y3), and control terminals configured to receive the first node voltages and cause, according to the first node voltages, the first output node, the second output node, the third output node and the fourth output node to be input with the first power supply voltage signal V1.

Figures 8, 9:
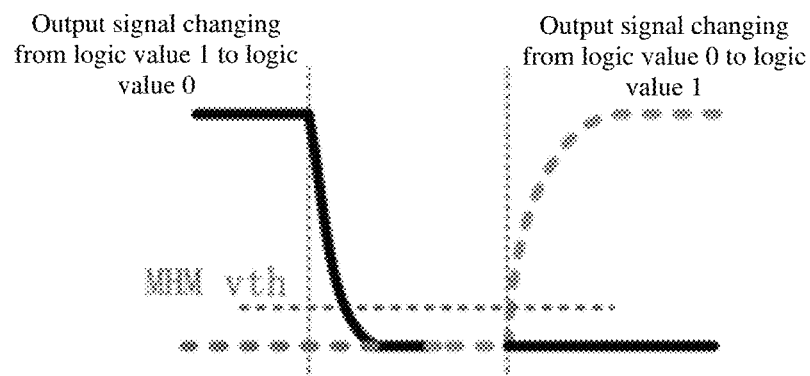
FIG. 8 is a truth table of an N-type level shift circuit in an embodiment of the present application.
FIG. 9 is an output waveform diagram of an N-type level shift circuit in an embodiment of the present application.

In the N-type level shift circuit in the embodiment of the present application, the first output control module causes, according to the second node voltages, the first output node (the node corresponding to the first output signal Y0), the second output node (the node corresponding to the second output signal Y1), the third output node (the node corresponding to the third output signal Y2) and the fourth output node (the node corresponding to the fourth output signal Y3) to be input with the second node voltages or the first node voltages, rather than being directly input with the second power supply voltage signal V2; and the second output control module causes, according to the first node voltages, the first output node, the second output node, the third output node and the fourth output node to be directly input with the first power supply voltage signal V1. In this way, the changes of the output voltages from the first output node, the second output node, the third output node and the fourth output node have certain delays, and thus the output voltages may not be overlapped during the transitions between high and low levels. The output waveform diagram of the N-type level shift circuit is shown in FIG. 9. It can be seen from FIG. 9, the output signal of the N-type level shift circuit starts the transition from the logic value 0 to the logic value 1 after the transition from the logic value 1 to the logic value 0 finished during the transitions between high and low levels according to the embodiment of the present application. In this way, the overlapping of the output signals (referred to as the output voltages in the embodiment of this application) during the transitions between high and low levels may be avoided, and thus the problem that interference may be introduced by the generation of short-circuit current in the DAC may be solved.

In an additional embodiment, referring to the N-type level shift circuit shown in FIG. 6, the control terminal of the third transistor M3 is connected to the first first node PG0, and the control terminal of the fourth transistor M4 is connected to the second first node PG1, the control terminal of the ninth transistor M9 is connected to the third first node YP0, and the control terminal of the tenth transistor M10 is connected to the fourth first node YP1; and the first output control module includes a first first output control sub-module 311, a second first output control sub-module 312, a third first output control sub-module 313 and a fourth first output control sub-module 314.

The first first output control sub-module 311 includes a thirteenth transistor M13 and a fourteenth transistor M14. The thirteenth transistor M13 has a first terminal connected to the first output node (the node corresponding to the first output signal Y0), a second terminal connected to a first terminal of the fourteenth transistor M14, and a control terminal connected to a second second node R1. The fourteenth transistor M14 has a second terminal connected to a third second node S0, and a control terminal connected to a fourth second node 51.

The second first output control sub-module 312 includes a fifteenth transistor M15 and a sixteenth transistor M16. The fifteenth transistor M15 has a first terminal connected to the second output node (the node corresponding to the second output signal Y1), a second terminal connected to a first terminal of the sixteenth transistor M16, and a control terminal connected to the fourth second node S1. The sixteenth transistor M16 has a second terminal connected to the second second node R1, and a control terminal connected to a first second node R0.

The third first output control sub-module 313 includes a seventeenth transistor M17 and an eighteenth transistor M18. The seventeenth transistor M17 has a first terminal connected to the third output node (the node corresponding to the third output signal Y2), a second terminal connected to a first terminal of the eighteenth transistor M18, and a control terminal connected to the third second node S0. The eighteenth transistor M18 has a second terminal connected to the first second node R0, and a control terminal connected to the second second node R1.

The fourth first output control sub-module 314 includes a nineteenth transistor M19 and a twentieth transistor M20. The nineteenth transistor has a first terminal connected to the fourth output node (the node corresponding to the fourth output signal Y3), a second terminal connected to a first terminal of the twentieth transistor M20, and a control terminal connected to the first second node R0. The twentieth transistor M20 has a second terminal connected to the fourth second node 51, and a control terminal connected to the third second node S0.

In another additional embodiment, referring to FIG. 7, the difference between FIG. 7 and FIG. 6 is that the control terminal of the third transistor M3, the control terminal of the fourth transistor M4, the control terminal of the ninth transistor M9 and the control terminal of the tenth transistor M10 each is connected to the bias voltage VBP terminal; and the second terminal of the fourteenth transistor M14 is connected to the third first node YP0, the second terminal of the sixteenth transistor M16 is connected to the second first node PG1, the second terminal of the eighteenth transistor M18 is connected to the first first node PG0, and the second terminal of the twentieth transistor M20 is connected to the fourth first node YP1.

Further, as shown in FIG. 6 and FIG. 7, the second output control module includes a first second output control sub-module 321, a second second output control sub-module 322, a third second output control sub-module 323, and a fourth second output control sub-module 324.

The first second output control sub-module 321 includes a twenty-first transistor M21 and a twenty-second transistor M22. A first terminal of the twenty-first transistor M21 and a first terminal of the twenty-second transistor M22 are both connected to the first power supply voltage signal terminal (the port for outputting the first power supply voltage signal V1), a second terminal of the twenty-first transistor M21 and a second terminal of the twenty-second transistor M22 are both connected to the first output node (a node corresponding to the first output signal Y0), a control terminal of the twenty-first transistor M21 is connected to the second first node PG1, and a control terminal of the twenty-second transistor M22 is connected to the fourth first node YP1. The second second output control sub-module 322 includes a twenty-third transistor M23 and a twenty-fourth transistor M24. A first terminal of the twenty-third transistor M23 and a first terminal of the twenty-fourth transistor M24 are both connected to the first power supply voltage signal terminal (a port for outputting the first power supply voltage signal V1), a second terminal of the twenty-third transistor M23 and a second terminal of the twenty-fourth transistor M24 are both connected to the second output node (a node corresponding to the second output signal Y1), a control terminal of the twenty-third transistor M23 is connected to the first first node PG0, and a control terminal of the twenty-fourth transistor M24 is connected to a fourth first node YP1. The third second output control sub-module 323 includes a twenty-fifth transistor M25 and a twenty-sixth transistor M26. A first terminal of the twenty-fifth transistor M25 and a first terminal of the twenty-sixth transistor M26 are both connected to the first power supply voltage signal terminal (a port for outputting the first power supply voltage signal V1), a second terminal of the twenty-fifth transistor M25 and a second terminal of the twenty-sixth transistor M26 are both connected to the third output node (a node corresponding to the third output signal Y2), a control terminal of the twenty-fifth transistor M25 is connected to the second first node PG1, and a control terminal of the twenty-sixth transistor M26 is connected to the third first node YP0. The fourth second output control sub-module 324 includes a twenty-seventh transistor M27 and a twenty-eighth transistor M28. A first terminal of the twenty-seventh transistor M27 and a first terminal of the twenty-eighth transistor M28 are both connected to the first power supply voltage signal terminal (a port for outputting the first power supply voltage signal V1), a second terminal of the twenty-seventh transistor M27 and a second terminal of the twenty-eighth transistor M28 are both connected to the fourth output node (a node corresponding to the fourth output signal Y3), a control terminal of the twenty-seventh transistor M27 is connected to the first first node PG0, and a control terminal of the twenty-eighth transistor M28 is connected to the third first node YP0.

Referring to FIG. 6 and FIG. 7, in the embodiment of the present application, the logic state of the first power supply voltage signal V1 is 0, and the logic state of the second power supply voltage signal V2 is 1. When the logic state of the first input voltage IN<0> and the logic state of the second input voltage IN<1> are both 0, the logic state of the third first node YP0 is 1, the logic state of the fourth first node YP1 is 0, the logic state of the third second node S0 is 1, the logic state of the fourth second node S1 is 0, the logic state of the first first node PG0 is 1, the logic state of the second first node PG1 is 0, the logic state of the first second node R0 is 1, the logic state of the second second node R1 is 0, the logic state of the first output signal Y0 is 1, and the logic states of the second output signal Y1, the third output signal Y2 and the fourth output signal Y3 are all 0.

Still referring to FIG. 6 and FIG. 7, when the logic state of the first input voltage IN<0> is 1 and the logic state of the second input voltage IN<1> is 0, the logic state of the third first node YP0 is 1, the logic state of the fourth first node YP1 is 0, the logic state of the third second node S0 is 1, the logic state of the fourth second node S1 is 0, the logic state of the first first node PG0 is 0, the logic state of the second first node PG1 is 1, the logic state of the first second node R0 is 0, the logic state of the second second node R1 is 1, the logic state of the second output signal Y1 is 1, and the logic states of the first output signal Y0, the third output signal Y2 and the fourth output signal Y3 are all 0.

Still referring to FIG. 6 and FIG. 7, when the logic state of the first input voltage IN<0> is 0 and the logic state of the second input voltage IN<1> is 1, the logic state of the third first node YP0 is 0, the logic state of the fourth first node YP1 is 1, the logic state of the third second node S0 is 0, the logic state of the fourth second node S1 is 1, the logic state of the first first node PG0 is 1, the logic state of the second first node PG1 is 0, the logic state of the first second node R0 is 1, the logic state of the second second node R1 is 0, the logic state of the third output signal Y2 is 1, and the logic states of the first output signal Y0, the second output signal Y1 and the fourth output signal Y3 are all 0.

Still referring to FIG. 6 and FIG. 7, when the logic state of the first input voltage IN<0> and the logic state of the second input voltage IN<1> are both 1, the logic state of the third first node YP0 is 0, the logic state of the fourth first node YP1 is 1, the logic state of the third second node S0 is 0, the logic state of the fourth second node 51 is 1, the logic state of the first first node PG0 is 0, the logic state of the second first node PG1 is 1, the logic state of the first second node R0 is 0, the logic state of the second second node R1 is 1, the logic state of the fourth output signal Y3 is 1, and the logic states of the first output signal Y0, the third output signal Y2 and the second output signal Y1 are all 0.

Therefore, the truth table of the N-type level shift circuit in the embodiment of the present application is shown in FIG. 8. It can be seen from the truth table that the N-type level shift circuit has functions similar to those of the 2-4 decoder, thus it has a decoding function. Therefore, when it is used to drive transistors of a digital-to-analog converter, the circuit structure of the digital-to-analog converter can be simplified and the circuit layout can be reduced.

Figure 10:
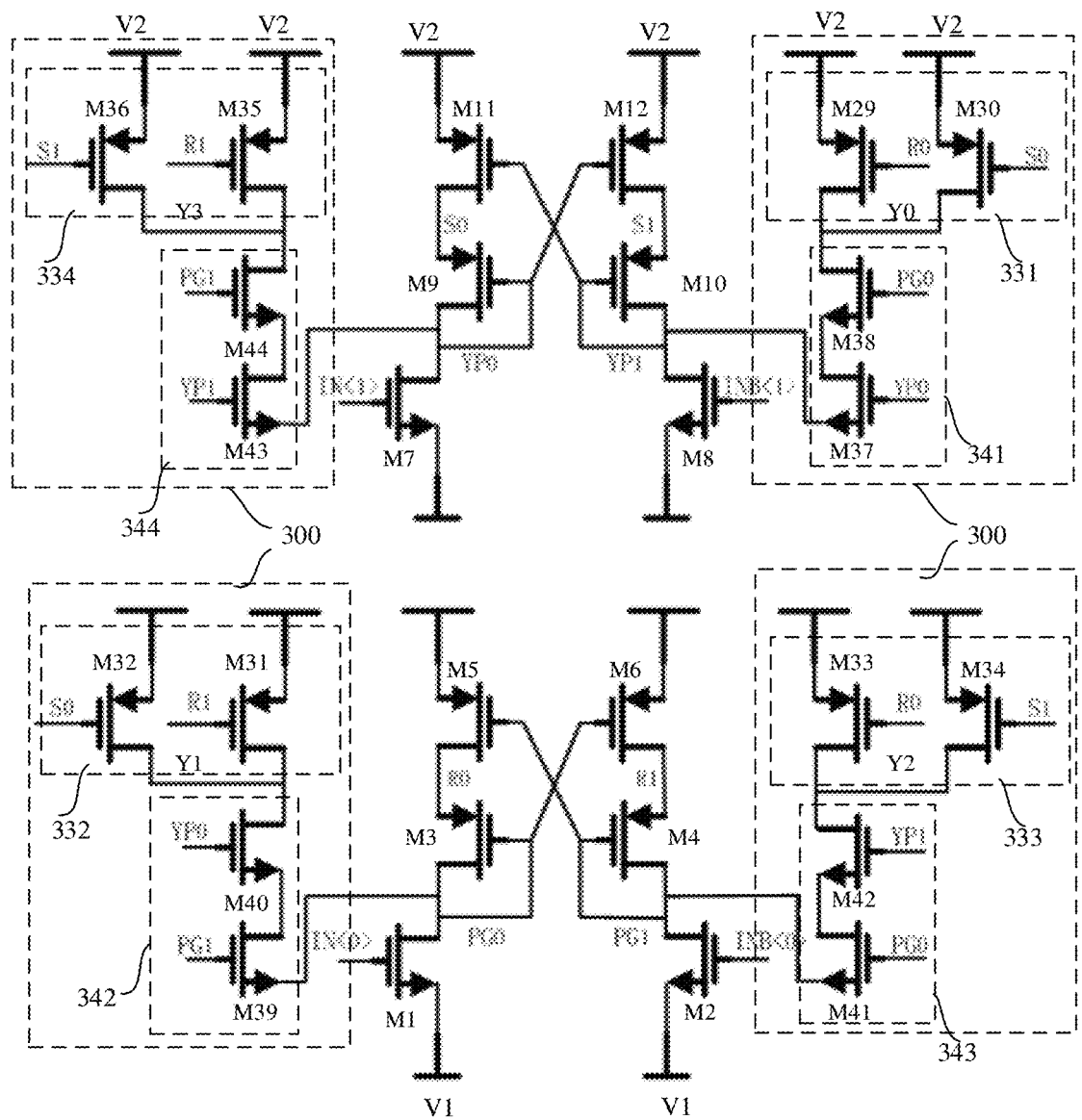
FIG. 10 is a schematic diagram of a P-type level shift circuit in an embodiment of the present application.
Figure 11:
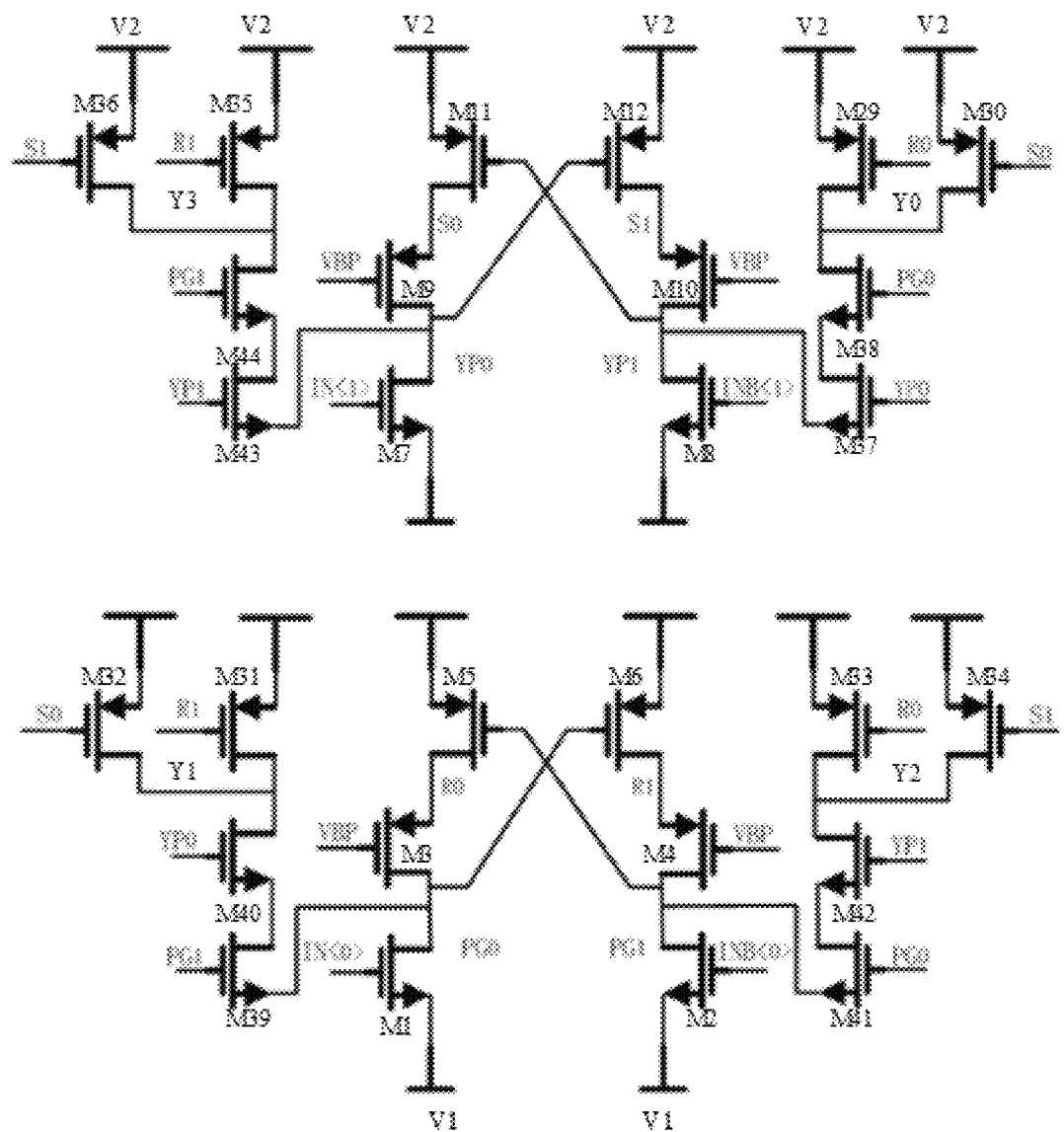
FIG. 11 is a schematic diagram of another P-type level shift circuit in an embodiment of the present application.

In another specific embodiment, referring to the P-type level shift circuit shown in FIG. 10 and FIG. 11, the plurality of node voltages include a plurality of first node voltages (the first nodes include PG0, PG1, YP0 and YP1 in FIG. 10 and FIG. 11) and a plurality of second node voltages (the second nodes include R0, R1, S0 and S1 in FIG. 10 and FIG. 11), and the output control module 300 includes a third output control module (331, 332, 333 and 314 in FIG. 10) and a fourth output control module (341, 342, 343 and 344 in FIG. 10).

The third output control module has first terminals respectively connected to a fifth output node corresponding to the fifth output signal Y0', a sixth output node corresponding to the sixth output signal Y1', a seventh output node corresponding to the seventh output signal Y2' and an eighth output node corresponding to the eighth output signal Y3', a second terminal connected to a second power supply voltage signal V2 terminal, control terminals configured to receive the second node voltages (R0, R1, S0 and S1) and cause, according to the second node voltages, the fifth output node (Y0'), the sixth output node (Y1'), the seventh output node (Y2') and the eighth output node (Y3') to be input with the second power supply voltage signal V2.

The fourth output control module has first terminals connected to first nodes (PG0, PG1, YP0 and YP1) corresponding to the first node voltages, second terminals respectively connected to the fifth output node (Y0'), the sixth output node (Y1'), the seventh output node (Y2') and the eighth output node (Y3'), and control terminals configured to receive the first node voltages (PG0, PG1, YP0 and YP1) and cause, according to the first node voltages, the fifth output node (Y0'), the sixth output node (Y1'), the seventh output node (Y2') and the eighth output node (Y3') to be input with the first node voltages.

Figures 12, 13:
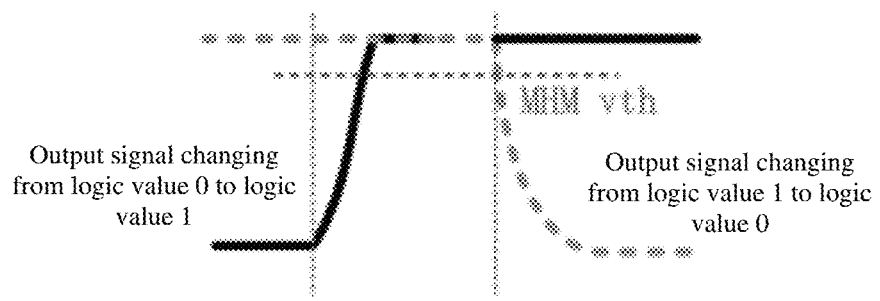
FIG. 12 is a truth table of a P-type level shift circuit in an embodiment of the present application.
FIG. 13 is an output waveform diagram of a P-type level shift circuit in an embodiment of the present application.

In the P-type level shift circuit in the embodiment of the present application, the third output control module causes, according to the second node voltages, the fifth output node (Y0'), the sixth output node (Y1'), the seventh output node (Y2') and the eighth output node (Y3') to be directly input with the second power supply voltage signal V2; and the fourth output control module causes, according to the first node voltage, the fifth output node (Y0'), the sixth output node (Y1'), the seventh output node (Y2') and the eighth output node (Y3') to be imputed with the first node voltages, rather than being directly input with the first power supply voltage signal V1. In this way, the drops of the output voltages Y1', Y2', Y3', Y4' have certain delays, as shown in FIG. 13. That is, the transition of the output voltage from the logic value 0 to the logic value 1 occurs first, followed by the transition of the output voltage from the logic value 1 to the logic value 0. Thus, the overlapping of the output voltages during the transitions between high and low levels, which may result in short-circuit in the digital-to-analog conversion and noise interference, may be avoided.

Similarly, in another specific embodiment, referring to the P-type level shift circuit shown in FIG. 10 and FIG. 11, the third output control module includes a first third output control sub-module 331, a second third output control sub-module 332, a third third output control sub-module module 333 and a fourth third output control sub-module 334. The first third output control sub-module 331 includes a twenty-ninth transistor M29 and a thirtieth transistor M30. First terminals of the twenty-ninth transistor M29 and the thirtieth transistor M30 are both connected to the fifth output node Y0', second terminals thereof are both connected to the second power supply voltage signal V2 terminal, and control terminals thereof are respectively connected to the first second node R0 and the third second node S0.

The second third output control sub-module 332 includes a thirty-first transistor M31 and a thirty-second transistor M32. First terminals of the thirty-first transistor M31 and the thirty-second transistor M32 are both connected to the sixth output node Y1', second terminals thereof are both connected to the second power supply voltage signal V2 terminal, and control terminals thereof are respectively connected to the second second node R1 and a third second node S0.

The third third output control sub-module 333 includes a thirty-third transistor M33 and a thirty-fourth transistor M34. First terminals of the thirty-third transistor M33 and the thirty-fourth transistor M34 are both connected to the seventh output node Y2', second terminals thereof are both connected to the second power supply voltage signal V2 terminal, and control terminals thereof are respectively connected to the first second node R0 and a fourth second node 51.

The fourth third output control sub-module 334 includes a thirty-fifth transistor M35 and a thirty-sixth transistor M36. First terminals of the thirty-fifth transistor M35 and the thirty-sixth transistor M36 are both connected to the eighth output node Y3', second terminals thereof are both connected to the second power supply voltage signal V2 terminal, and control terminals thereof are respectively connected to the second second node R1 and a fourth second node S1.

Further, referring to the P-type level shift circuit shown in FIG. 10 and FIG. 11, the fourth output control module includes a first fourth output control sub-module 341, a second fourth output control sub-module 342, a third fourth output control sub-module 343, and a fourth fourth output control sub-module 344.

The first fourth output control sub-module 341 includes a thirty-seventh transistor M37 and a thirty-eighth transistor M38. The thirty-seventh transistor M37 has a first terminal connected to the fourth first node YP1, a second terminal connected to a first terminal of the thirty-eighth transistor M38, and a control terminal connected to the third first node YP0. The thirty-eighth transistor M38 has a second terminal connected to the fifth output node YP0', and a control terminal connected to the first first node PG0.

The second fourth output control sub-module 342 includes a thirty-ninth transistor M39 and a fortieth transistor M40. The thirty-ninth transistor M39 has a first terminal connected to the first first node PG0, a second terminal connected to a first terminal of the fortieth transistor M40, and a control terminal connected to the second first node PG1. The fortieth transistor M40 has a second terminal connected to the sixth output node Y1', and a control terminal connected to the third first node YP0.

The third fourth output control sub-module 343 includes a forty-first transistor M41 and a forty-second transistor M42. The forty-first transistor M41 has a first terminal connected to the second first node PG1, a second terminal connected to a first terminal of the forty-second transistor M42, and a control terminal connected to the first first node PG0. The forty-second transistor M42 has a second terminal connected to the seventh output node Y2', and a control terminal connected to the fourth first node YP1.

The fourth fourth output control sub-module 344 includes a forty-third transistor M43 and a forty-fourth transistor M44. The forty-third transistor M43 has a first terminal connected to the third first node YP0, a second terminal connected to a first terminal of the forty-fourth transistor M44, and a control terminal connected to the fourth first node YP1. The forty-fourth transistor M44 has a second terminal connected to the eighth output node Y3', and a control terminal connected to the second first node PG1.

Referring to FIG. 10 and FIG. 11, in the embodiment of the present application, the logic state of the first power supply voltage signal V1 is 0, and the logic state of the second power supply voltage signal V2 is 1. When the logic state of the first input voltage IN<0> and the logic state of the second input voltage IN<1> are both 0, the logic state of the third first node YP0 is 1, the logic state of the fourth first node YP1 is 0, the logic state of the third second node S0 is 1, the logic state of the fourth second node Si is 0, the logic state of the first first node PG0 is 1, the logic state of the second first node PG1 is 0, the logic state of the first second node R0 is 1, the logic state of the second second node R1 is 0, the logic state of the fifth output signal Y0' is 0, and the logic states of the sixth output signal Y1', the seventh output signal Y2' and the eighth output signal Y3' are all 1.

Still referring to FIG. 10 and FIG. 11, when the logic state of the first input voltage IN<0> and the logic state of the second input voltage IN<1> are both 0, the logic state of the third first node YP0 is 1, the logic state of the fourth first node YP1 is 0, the logic state of the third second node S0 is 1, the logic state of the fourth second node 51 is 0, the logic state of the first first node PG0 is 0, the logic state of the second first node PG1 is 1, the logic state of the first second node R0 is 0, the logic state of the second second node R1 is 1, the logic state of the sixth output signal Y1' is 0, and the logic states of the fifth output signal Y0', the seventh output signal Y2' and the eighth output signal Y3' are all 1.

Still referring to FIG. 10 and FIG. 11, when the logic state of the first input voltage IN<0> is 0 and the logic state of the second input voltage IN<1> is 1, the logic state of the third first node YP0 is 0, the logic state of the fourth first node YP1 is 1, the logic state of the third second node S0 is 0, the logic state of the fourth second node S1 is 1, the logic state of the first first node PG0 is 1, the logic state of the second first node PG1 is 0, the logic state of the first second node R0 is 1, the logic state of the second second node R1 is 0, the logic state of the seventh output signal Y2' is 0, and the logic states of the fifth output signal Y0', the sixth output signal Y1' and the eighth output signal Y3' are all 1.

Still referring to FIG. 10 and FIG. 11, when the logic state of the first input voltage IN<0>and the logic state of the second input voltage IN<1> are both 1, the logic state of the third first node YP0 is 0, the logic state of the fourth first node YP1 is 1, the logic state of the third second node S0 is 0, the logic state of the fourth second node S1 is 1, the logic state of the first first node PG0 is 0, the logic state of the second first node PG1 is 1, the logic state of the first second node R0 is 0, the logic state of the second second node R1 is 1, the logic state of the eighth output signal Y3' is 0, and the logic states of the fifth output signal Y0', the sixth output signal Y1' and the seventh output signal Y2' are all 1.

Therefore, the truth table of the P-type level shift circuit in the embodiment of the present application is shown in FIG. 12. It can be seen from the truth table that the P-type level shift circuit has functions similar to those of the 2-4 decoder, thus it has a decoding function. Therefore, when it is used to drive transistors of a digital-to-analog converter, the circuit structure of the digital-to-analog converter can be simplified and the circuit layout can be reduced.

For specific implementation, referring to FIG. 6, FIG. 7, FIG. 10 and FIG. 11, M1-M2, M7-M8, M21-M28, M37-M44 may be provided as high-voltage N-type MOS transistors, and M3-M6, M9-M12, M13-M20, M29-M36 may be provided as high-voltage P-type MOS transistors, and those skilled in the art can select the type of transistors M1-M44 according to actual design requirements.

Based on the same inventive concept, the present application provides an integrated circuit, including the above-mentioned level shift circuit. The integrated circuit further includes: a digital-to-analog converter. The output signal from the level shift circuit in the embodiment of the present application is used to control transistors in the digital-to-analog converter to be turned on or off. The integrated circuit has the same beneficial effects as the level shift circuit, which will not be repeated here.

Based on the same inventive concept, the present application provides an electronic device including the above-mentioned integrated circuit. The electronic device has the same beneficial effects as the above-mentioned integrated circuit, which will not be repeated here.

Specifically, the electronic device in the embodiment of the present application may be a display, or may be other devices integrated with the above-mentioned integrated circuit.

The technical solutions in the embodiments of the present application have the following beneficial effects.

The level shift circuit in the embodiment of the present application comprises: an input module, configured to output a first control signal according to a first power supply voltage signal, a first input voltage, a second input voltage, an inverted voltage of the first input voltage and an inverted voltage of the second input voltage that received; a control voltage generation module, configured to receive the first control signal, and generate a plurality of node voltages according to the first control signal and the second power supply voltage signal; and output control modules, configured to generate a first output signal, a second output signal, a third output signal and a fourth output signal according to the node voltages and the first power supply voltage signal, or generate a fifth output signal, a sixth output signal, a seventh output signal, and an eighth output signal according to the second power supply voltage signal and the node voltages. In the embodiment of the present application, the input module and the control voltage generation module generate node voltages according to an input voltage signal, and then control output control modules through the node voltages to generate output voltages. The output signals may not be overlapped during the transitions between high and low levels due to delays of changes among the node voltages. Therefore, the generation of short-circuit current when some transistor switches in an analog-to-digital converter are turned on at the same time may be avoided. In addition, four different logic states of the first input voltage and the second input voltage respectively indicate that the first output signal, the second output signal, the third output signal, and the fourth output signal are in high level, and in each logic state, only one output signal is in high level and the other three output signals are in low level; and four different logic states of the first input voltage and the second input voltage respectively indicate that the fifth output signal, the sixth output signal, the seventh output signal, and the eighth output signal are in low level, and in each logic state, only one output signal is in low level and the other three output signals are in high level. Therefore, the level shift circuit in the embodiment of the present application has a decoding function, and thus the circuit structure of the digital-to-analog converter may be simplified.

It may be understood by a person of ordinary skill in the art that the operations, methods, steps in the flows, measures and solutions already discussed in the present application may be alternated, changed, combined or deleted. Further, the operations, methods, other steps in the flows, measures and solutions already discussed in the present application may also be alternated, changed, rearranged, decomposed, combined or deleted.

In the description of the present application, it should be understood that orientations or location relationships indicated by terms such as "center", "up", "down", "front", "rear", "left", "right", "vertical", "horizontal", "top", "bottom", "inside" and "outside" are orientations and location relationships illustrated in the accompanying drawings, merely for ease of describing the present application and simplifying the description, rather than to indicate or imply that the stated devices or elements must have a specific orientation and be constructed and operated in a specific orientation, and shall not be regarded as any limitation to the present application.

The terms "first" and "second" are simply used for the purpose of description, and should not be regarded as indicating or implying relative importance or implicitly indicating the number of indicated technical features. Therefore, the features defined as "first" and "second" may explicitly or implicitly include one or more of the features. In the description of the present application, unless specifically stated otherwise, "a plurality of" means "two" or "more than two".

In the description, the specific features, structures, materials, or characteristics may be combined in a proper manner in any one or more embodiments or examples.

It should be understood that although the steps in the flowchart shown in the drawings are sequentially displayed by following the arrows, these steps are not necessarily performed in the order indicated by the arrows. Unless explicitly stated herein, the execution order of these steps is not strictly limited, and they can be performed in other orders. Moreover, at least some of the steps in the flowcharts shown in the drawings may include multiple sub-steps or multiple stages. These sub-steps or stages are not necessarily performed at the same time, and instead, may be performed at different moments. The sub-steps or stages are not necessarily performed sequentially, and instead, may be performed in turn or alternately with other steps or at least some of the sub-steps or stages of other steps.

The foregoing descriptions are merely some implementations of the present application. It should be noted that, to a person of ordinary skill in the art, various improvements and modifications may be made without departing from the principle of the present application, and these improvements and modifications shall be deemed as falling into the protection scope of the present application.

REFERENCE NUMERALS

100: input module; 200: control voltage generation module; 300: output control module; 110: first input sub-module; 120: second input sub-module; 211: first bias unit; 212: second bias unit; 221: first load unit; 222: second load unit; 311: first first output control sub-module; 312: second first output control sub-module; 313: third first output control sub-module; 314: fourth first output control sub-module; 321: first second output control sub-module; 322: second second output control sub-module; 323: third second output control sub-module; 324: fourth second output control sub-module module; 331: first third output control sub-module; 332: second third output control sub-module; 333: third third output control sub-module; 334: fourth third output control sub-module; 341: first fourth output control sub-module; 342: second fourth output control sub-module; 343: third fourth output control sub-module; 344: fourth fourth output control sub-module.

What is claimed is:

1. A level shift circuit, comprising:
   an input module, configured to output a first control signal according to a first power supply voltage signal, a first input voltage, a second input voltage, an inverted voltage of the first input voltage and an inverted voltage of the second input voltage that received;
   a control voltage generation module, configured to receive the first control signal and generate a plurality of node voltages according to the first control signal and a second power supply voltage signal; and
   output control modules, configured to generate a first output signal, a second output signal, a third output signal and a fourth output signal according to the node voltages and the first power supply voltage signal;
   wherein four different logic states of the first input voltage and the second input voltage respectively indicate that the first output signal, the second output signal, the third output signal, and the fourth output signal are in high level, and in each logic state, only one output signal is in high level and the other three output signals are in low level.

2. The level shift circuit according to claim 1, wherein the plurality of node voltages comprise a plurality of first node voltages and a plurality of second node voltages, and the output control modules comprise a first output control module and a second output control module;
   the first output control module has first terminals respectively connected to a first output node corresponding to the first output signal, a second output node corresponding to the second output signal, a third output node corresponding to the third output signal and a fourth output node corresponding to the fourth output signal, and second terminals connected to second nodes corresponding to the second node voltages, and a control terminal configured to receive the second node voltages and cause, according to the second node voltages, the first output node, the second output node, the third output node and the fourth output node to be input with the second node voltages; and
   the second output control module has a first terminal connected to a first power supply voltage signal terminal, and second terminals respectively connected to the first output node, the second output node, the third output node and the fourth output node and a control terminal configured to receive the first node voltage and cause, according to the first node voltages, the first output node, the second output node, the third output node and the fourth output node to be input with the first power supply voltage signal.

3. The level shift circuit according to claim 2, wherein the input module comprises a first input sub-module and a second input sub-module;
   the first input sub-module comprises a first transistor and a second transistor;
   the first transistor has a first terminal connected to the first power supply voltage signal terminal, a second terminal connected to a first one of first nodes corresponding to the first node voltages, and a control terminal connected to the first input voltage;
   the second transistor has a first terminal connected to the first power supply voltage signal terminal, a second terminal connected to a second one of the first nodes, and a control terminal connected to an inverted voltage of the first input voltage;
   the second input sub-module comprises a seventh transistor and an eighth transistor;
   the seventh transistor has a first terminal connected to the first power supply voltage signal terminal, a second terminal connected to a third one of the first nodes, and a control terminal connected to the second input voltage; and
   the eighth transistor has a first terminal connected to the first power supply voltage signal terminal, a second terminal connected to a fourth one of the first nodes, and a control terminal connected to an inverted voltage of the second input voltage.

4. The level shift circuit according to claim 3, wherein the control voltage generation module comprises a first bias unit, a second bias unit, a first load unit and a second load unit;
   the first bias unit is configured to limit voltages of the first one of the first nodes and the second one of the first node, and the second bias unit is configured to limit voltages of the third one of the first nodes and the fourth one of the first nodes;
   the first load unit is configured to control voltages of a first one of the second nodes and a second one of the second nodes according to the voltages of the first one of the first nodes and the second one of the first nodes; and
   the second load unit is configured to control voltages of a third one of the second node and a fourth one of the second nodes according to the voltages of the third one of the first nodes and the fourth one of the first nodes.

5. The level shift circuit according to claim 4, wherein the first bias unit comprises a third transistor and a fourth transistor;
   the third transistor has a first terminal connected to the first one of the first nodes, a second terminal connected to the first one of the second nodes, and a control terminal connected to the first one of the first nodes; and the fourth transistor has a first terminal connected to the second one of the first nodes, a second terminal connected to the second one of the second nodes, and a control terminal connected to the second one of the first nodes;

the first load unit comprises a fifth transistor and a sixth transistor;

the fifth transistor has a first terminal connected to the first one of the second nodes, a control terminal connected to the second one of the first nodes, and a second terminal connected to the second power supply voltage signal terminal; and the sixth transistor has a first terminal connected to the second one of the second nodes, a control terminal connected to the first one of the first nodes, and a second terminal connected to the second power supply voltage signal terminal;

the second bias unit comprises a ninth transistor and a tenth transistor;

the ninth transistor has a first terminal connected to the third one of the first nodes, a second terminal connected to the third one of the second nodes, and a control terminal connected to the third one of the first nodes; and the tenth transistor has a first terminal connected to the fourth one of the first nodes, a second terminal connected to the fourth one of the second nodes, and a control terminal connected to the fourth one of the first nodes;

the second load unit comprises an eleventh transistor and a twelfth transistor; and the eleventh transistor has a first terminal connected to the third one of the second nodes, a control terminal connected to the fourth one of the first nodes, and a second terminal connected to the second power supply voltage signal terminal; and the twelfth transistor has a first terminal connected to the fourth one of the second nodes, a control terminal connected to the third one of the first nodes, and a second terminal connected to the second power supply voltage signal terminal.

6. The level shift circuit according to claim 2, wherein the first output control module comprises a first first output control sub-module, a second first output control sub-module, a third first output control sub-module module and a fourth first output control sub-module;

the first first output control sub-module comprises a thirteenth transistor and a fourteenth transistor;

the thirteenth transistor has a first terminal connected to the first output node, a second terminal connected to a first terminal of the fourteenth transistor, and a control terminal connected to a second one of the second nodes; and the fourteenth transistor has a second terminal connected to a third one of the second nodes, and a control terminal connected to a fourth one of the second nodes;

the second first output control sub-module comprises a fifteenth transistor and a sixteenth transistor;

the fifteenth transistor has a first terminal connected to the second output node, a second terminal connected to a first terminal of the sixteenth transistor, and a control terminal connected to the fourth one of the second nodes; and the sixteenth transistor has a second terminal connected to the second one of the second nodes, and a control terminal connected to a first one of the second nodes;

the third first output control sub-module comprises a seventeenth transistor and an eighteenth transistor;

the seventeenth transistor has a first terminal connected to the third output node, a second terminal connected to a first terminal of the eighteenth transistor, and a control terminal connected to the third one of the second nodes; and the eighteenth transistor has a second terminal connected to the first one of the second nodes, and a control terminal connected to the second one of the second nodes;

the fourth first output control sub-module comprises a nineteenth transistor and a twentieth transistor; and the nineteenth transistor has a first terminal connected to the fourth output node, a second terminal connected to a first terminal of the twentieth transistor, and a control terminal connected to the first one of the second nodes; and the twentieth transistor has a second terminal connected to the fourth one of the second nodes, and a control terminal connected to the third one of the second nodes.

7. The level shift circuit according to claim 6, wherein the second output control module comprises a first second output control sub-module, a second second output control sub-module, a third second output control sub-module, and a fourth second output control sub-module;

the first second output control sub-module comprises a twenty-first transistor and a twenty-second transistor;

a first terminal of the twenty-first transistor and a first terminal of the twenty-second transistor are both connected to the first power supply voltage signal terminal, a second terminal of the twenty-first transistor and a second terminal of the twenty-second transistor are both connected to the first output node, a control terminal of the twenty-first transistor is connected to a second one of first nodes corresponding to the first node voltages, and a control terminal of the twenty-second transistor is connected to the fourth one of the first nodes;

the second second output control sub-module comprises a twenty-third transistor and a twenty-fourth transistor;

a first terminal of the twenty-third transistor and a first terminal of the twenty-fourth transistor are both connected to the first power supply voltage signal terminal, a second terminal of the twenty-third transistor and a second terminal of the twenty-fourth transistor are both connected to the second output node, a control terminal of the twenty-third transistor is connected to a first one of the first nodes, and a control terminal of the twenty-fourth transistor is connected to the fourth one of the first nodes;

the third second output control sub-module comprises a twenty-fifth transistor and a twenty-sixth transistor;

a first terminal of the twenty-fifth transistor and a first terminal of the twenty-sixth transistor are both connected to the first power supply voltage signal terminal, a second terminal of the twenty-fifth transistor and a second terminal of the twenty-sixth transistor are both connected to the third output node, a control terminal of the twenty-fifth transistor is connected to the second one of the first nodes, and a control terminal of the twenty-sixth transistor is connected to the third one of the first nodes;

the fourth second output control sub-module comprises a twenty-seventh transistor and a twenty-eighth transistor; and a first terminal of the twenty-seventh transistor and a first terminal of the twenty-eighth transistor are both connected to the first power supply voltage signal terminal, a second terminal of the twenty-seventh transistor and a second terminal of the twenty-eighth transistor are both connected to the fourth output node, a control terminal of the twenty-seventh transistor is connected to the first one of the first nodes, and a control terminal of the twenty-eighth transistor is connected to the third one of the first nodes.

8. An integrated circuit, comprising the level shift circuit according to claim 1, further comprising a digital-to-analog converter; and
an output signal from the level shift circuit is used to control transistors in the digital-to-analog converter to be turned on or off.

9. An electronic device, comprising the integrated circuit according to claim 8.

* * * * *